US012763119B2

(12) United States Patent
Fujimaki

(10) Patent No.: US 12,763,119 B2
(45) Date of Patent: Oct. 13, 2026

(54) RTT TRIM METHOD

(71) Applicant: Micron Technology, Inc., Boise, ID (US)

(72) Inventor: Ryo Fujimaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 18/760,570

(22) Filed: Jul. 1, 2024

(65) Prior Publication Data

US 2025/0218483 A1 Jul. 3, 2025

Related U.S. Application Data

(60) Provisional application No. 63/615,849, filed on Dec. 29, 2023.

(51) Int. Cl.
*G11C 7/10* (2006.01)
*G11C 7/22* (2006.01)

(52) U.S. Cl.
CPC ............ *G11C 7/222* (2013.01); *G11C 7/1057* (2013.01); *G11C 7/109* (2013.01); *G11C 7/225* (2013.01); *G11C 7/1048* (2013.01); *G11C 2207/2254* (2013.01)

(58) Field of Classification Search
CPC ....... G11C 7/222; G11C 7/1057; G11C 7/109; G11C 7/225; G11C 7/1048; G11C 2208/2254
See application file for complete search history.

(56) References Cited

U.S. PATENT DOCUMENTS

| | | | | |
|---|---|---|---|---|
| 2007/0148796 A1* | 6/2007 | Nakamura | G11C 7/1057 | 257/48 |
| 2019/0139586 A1* | 5/2019 | Jung | G11C 29/028 | |
| 2019/0158320 A1 | 5/2019 | Kwon et al. | | |
| 2021/0065753 A1 | 3/2021 | Lee et al. | | |
| 2021/0099172 A1* | 4/2021 | Kang | H03K 19/018578 | |
| 2021/0327476 A1* | 10/2021 | Lee | G11C 7/1087 | |
| 2023/0142493 A1* | 5/2023 | Kim | G11C 7/1084 | 365/189.18 |
| 2023/0326497 A1* | 10/2023 | Li | G11C 7/1048 | 365/189.18 |

OTHER PUBLICATIONS

International Search Report and Written Opinion for PCT Application No. PCT/US2024/039833, Mailed Nov. 5, 2024, 10 pages.

* cited by examiner

*Primary Examiner* — Dominic E Hawkins
(74) *Attorney, Agent, or Firm* — Fletcher Yoder, P.C.

(57) ABSTRACT

Systems and methods are provided for trimming RTTs in a memory device. The effective termination resistance (RTT) of the ODT may be adjusted by adjusting one or more driver units having predefined values (e.g., 240Ω). Because PVT characteristics may impact the driver unit values, resistances of the driver units may be fluctuated away from the predefined values (e.g., 240Ω). ZQ calibration signals may be used to calibrate the resistances of the driver units to the predefined values (e.g., 240Ω) to trim the RTTs. Separate ZQ calibration signals may be generated for different circuits (e.g., a circuit associated with DQ pad, a circuit associated with CA pad).

20 Claims, 8 Drawing Sheets

RTT TRIM METHOD

CROSS-REFERENCE TO RELATED APPLICATIONS

This application claims priority to U.S. Provisional Application No. 63/615,849, filed Dec. 29, 2023, which is incorporated by reference herein in its entirety.

BACKGROUND OF THE INVENTION

Field of the Invention

The present disclosure relates generally to the field of semiconductor memory devices. More specifically, embodiments of the present disclosure relate to termination resistance (RTT) trimming in a memory device.

Description of the Related Art

An impedance (ZQ) calibration signal may be used in a memory device to tune output drivers and on die termination (ODT) values by adjusting pull-up and pull-down resistors of the memory device across changes in process, voltage and temperature (PVT) values. The effective termination resistance (RTT) of the ODT may be adjusted by adjusting an output impedance of an output driver, which may include one or more driver units having predefined values (e.g., 240Ω). The RTT may be used to suppress signal reflection and reduce noise on a transmission line (e.g., connecting the memory device to a host device). Because PVT characteristics may impact the driver units, resistances of the driver units may be fluctuated away from the predefined values (e.g., 240Ω), which may affect the RTT values. ZQ calibration command may be defined to calibrate the driver unit to the predefined value in various PVT. However, it is difficult to trim RTTs associated with different external pins.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously mentioned, the PVT characteristics may impact the driver units, and resistances of the driver units may be fluctuated away from the predefined values (e.g., 240Ω), which may affect the RTT values. Since the RTT may be used to suppress signal reflection and reduce noise on a transmission line (e.g., connecting the memory device to a host device), it is desirable to trim the RTT. The current disclosure herein provides systems and methods for trimming RTTs in a memory device. The effective termination resistance (RTT) of the ODT may be adjusted by adjusting one or more driver units having predefined values (e.g., 240Ω). ZQ calibration signals may be used to calibrate the resistances of the driver units to the predefined values (e.g., 2400) to trim the RTTs. Separate ZQ calibration signals may be generated for different circuits (e.g., a circuit associated with DQ pad, a circuit associated with CA pad). In addition, two ZQ calibration signals may be generated in parallel or simultaneously by a ZQ circuit during the same time period.

Figure 1:
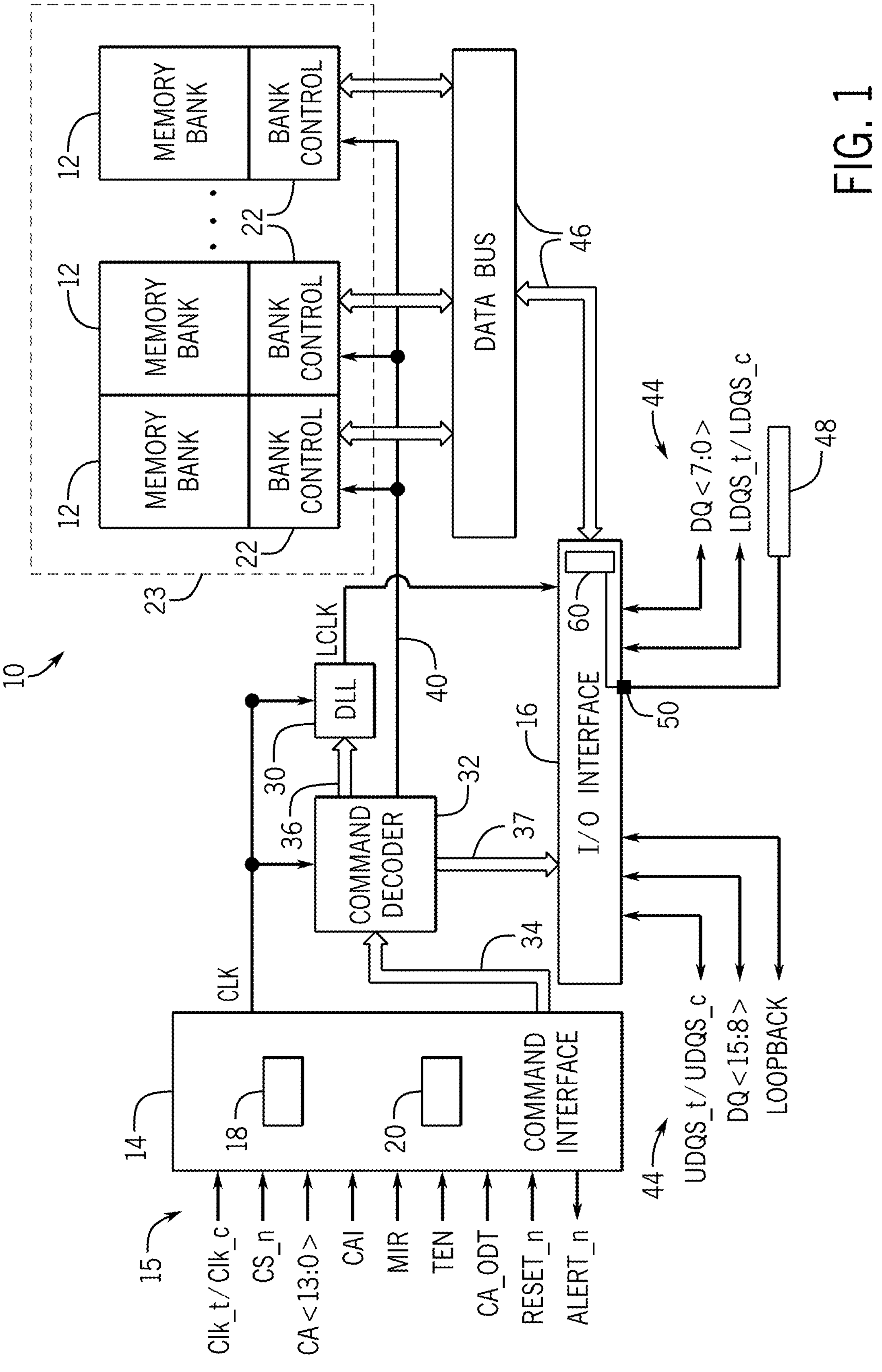
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12 arranged into 8 bank groups with each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command/address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from a command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over a bus 37 to facilitate receiving and transmitting I/O signals. The phase controlled internal clock signal LCLK may be used to clock data through the I/O interface 16, for instance.

Further, the command decoder 32 may decode commands received from the command bus 34, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. A group of the memory banks 12 may be included in a memory chip 23, and the memory device 10 may include one or more memory chips.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command/address input circuit 20 in the command interface 14 may be configured to receive and transmit the commands to provide access to the memory banks 12, through the command decoder 32, for instance. In addition, the command interface 14 may receive a chip select signal (CS_n). The chip select signal CS_n enables the memory device 10 to process commands on the incoming command/address signals CA<13:0> for the memory chip selected by the chip select signal CS_n. Accordingly, access to specific banks 12 within the memory device 10 is facilitated by the information encoded on the chip select signal CS_n and the command/address signals CA<13:0>.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 at the I/O interface 16. The ZQ calibration signal may be used to tune output drivers and on die termination (ODT) values of external pins (e.g., DQ pad, CA pad) by adjusting pull-up and pull-down driver units of the memory device 10 across changes in process, voltage and temperature (PVT) values. The effective termination resistance (RTT) of the ODT may be adjusted by adjusting an output impedance of an output driver, which may include one or more driver units having predefined values (e.g., 240Ω). Because PVT characteristics may impact the driver unit values, resistances of the driver units may be fluctuated away from the predefined values (e.g., 240Ω). Since the RTT may be used to suppress signal reflection and reduce noise on a transmission line (e.g., connecting the memory device to a host device), it is desirable to tune the RTT to a known value. The driver units are made tunable, and the ZQ calibration signal may be used to calibrate the resistances of the driver units to the predefined values (e.g., 2400) by using an external resistor having precise resistance. This process is called ZQ calibration. As will be appreciated, a precision resistor 48 (e.g., 240 ohm (Ω)) is generally coupled between a ZQ pad 50 on the memory device 10 and GND/VSS external to the memory device 10. This precision resistor 48 acts as a reference for the RTT trimming. The ZQ calibration signal may be generated by a ZQ circuit 60 coupled to the ZQ pad 50, as described in detail herein. The ZQ calibration signal may be used to calibrate RTTs coupled to the DQ pad (e.g., DQ<7:0>, DQ<15:8>) and the DQS pad (e.g., UDQS_t/UDQS_c, LDQS_t/LDQS_c) on the I/O interface 16. The ZQ calibration signal may also be used to calibrate RTTs coupled to the clock (CK) pad (e.g., Clk_t/Clk_c), chip select (CS) pad (e.g., CS_n), and command/address (CA) pad (e.g., CA_ODT, CA<13:0>) on the command interface 14. Since the power supply resistance may be different for DQ circuit areas (e.g., circuits associated with DQ pad and DQS pad on the I/O interface 16) and CA circuit areas (e.g., circuits associated with CK pad, CS pad, and CA pad on the command interface 14), using the same ZQ calibration signal in the RTT trimming of the DQ circuit areas and the CA circuit areas may cause inaccurate RTT values in either the DQ circuit areas or the CA circuit areas. In addition, in some applications, it is desirable to send different ZQ calibration signals to DQ circuit areas and CA circuit areas, such as for rank margining tool (RMT) improvement, or compensations of Joint Electron Device Engineering Council (JEDEC) standard specification violations due to on chip variation or layout issues, etc. Accordingly, it is desirable to trim the RTTs of the DQ circuit areas and the CA circuit areas, separately.

In addition, a loopback signal (LOOPBACK) may be provided to the memory device 10 through the I/O interface 16. The loopback signal may be used during a test, debugging phase, or training phase to set the memory device 10 into a mode wherein signals are looped back through the memory device 10. For instance, the loopback signal may be used to set the memory device 10 to test the data input of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

Figure 2:
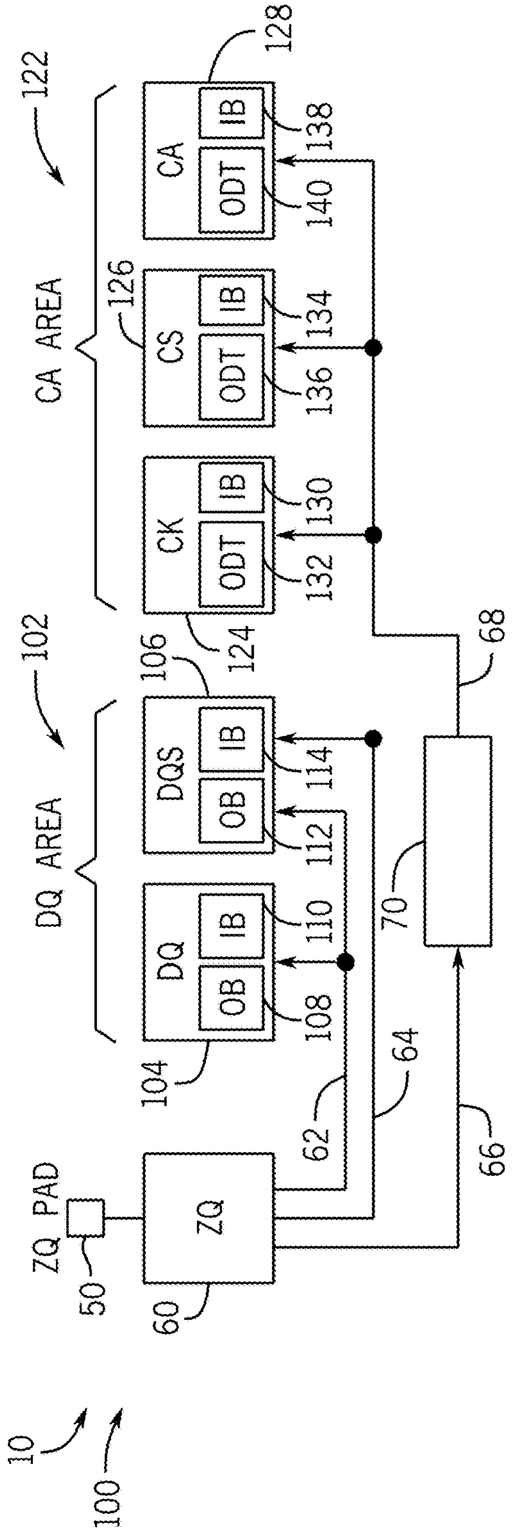
FIG. 2 illustrates a block diagram of a portion of an RTT trim circuit having a logic block, according to an embodiment of the present disclosure.

FIG. 2 is a block diagram of a portion of an RTT trim circuit 100 for implementing the ZQ circuit 60 to trim the RTTs of the memory device 10. The RTT trim circuit 100 may include one or more DQ circuit areas that may include adjustable driver units, such as a DQ circuit area 102, which may include a DQ block 104 (e.g., circuits associated with DQ pad on the I/O interface 16) and a DQS block 106 (e.g., circuits associated with DQS pad on the I/O interface 16). The DQ block 104 may include an input buffer 108 and an output buffer 110. The DQS block 106 may include an input buffer 112 and an output buffer 114. The memory device 10 may include one or more CA circuit areas that may include adjustable driver units, such as a CA circuit area 122, which may include a CK block 124 (e.g., circuits associated with CK pad on the command interface 14), a CS block 126 (e.g., circuits associated with CS pad on the command interface 14), and a CA block 128 (e.g., circuits associated with CA pad on the command interface 14). The CK block 124 may include an input buffer 130 and an ODT 132. The CS block 126 may include an input buffer 134 and an ODT 136. The CA block 128 may include an input buffer 138 and an ODT 140. The DQ circuit areas 102 may include pull-up drivers and pull-down drivers for the DQ block 104 and the DQS block 106. In one embodiment, the CA circuit areas 122 may include termination drivers connected to an upper voltage (e.g., VDD) for the ODT (e.g., the ODT 132, the ODT 136, the ODT 140). In another embodiment, the CA circuit areas 122 may include termination drivers connected to a lower voltage (e.g., VSS) for the ODT (e.g., the ODT 132, the ODT 136, the ODT 140). For example, in active mode (e.g., read operation, write operation), both pull-up and pull-down drivers may be activated in the DQ circuit areas 102, and the termination drivers may be activated in the CA circuit areas 122; while in ODT mode, the pull-up drivers or the pull-down drivers may be activated in the DQ circuit area 102 as termination resistors, and the termination drivers may be activated in the CA circuit areas 122.

In FIG. 2, the ZQ circuit 60 may output a ZQ pull down calibration signal 62 for adjusting pull-down driver units and a ZQ pull up calibration signal 64 for adjusting pull-up driver units. The ZQ pull down calibration signal 62 may include a ZQ code (pull down) that may be used to adjust the pull-down driver units, and the ZQ pull up calibration signal 64 may include a ZQ code (pull up) that may be used to adjust the pull-up driver units. ZQ code is a binary code that is used to adjust resistor driver strength and tune corresponding driver units. Different ZQ codes correspond to different resistances of the driver units. Accordingly, generating the ZQ calibration signals includes obtaining the corresponding ZQ codes. The ZQ pull down calibration signal 62 may be sent to the DQ block 104 and the DQS block 106, and the ZQ pull up calibration signal 64 may be sent to the DQS block 106.

Figure 3:
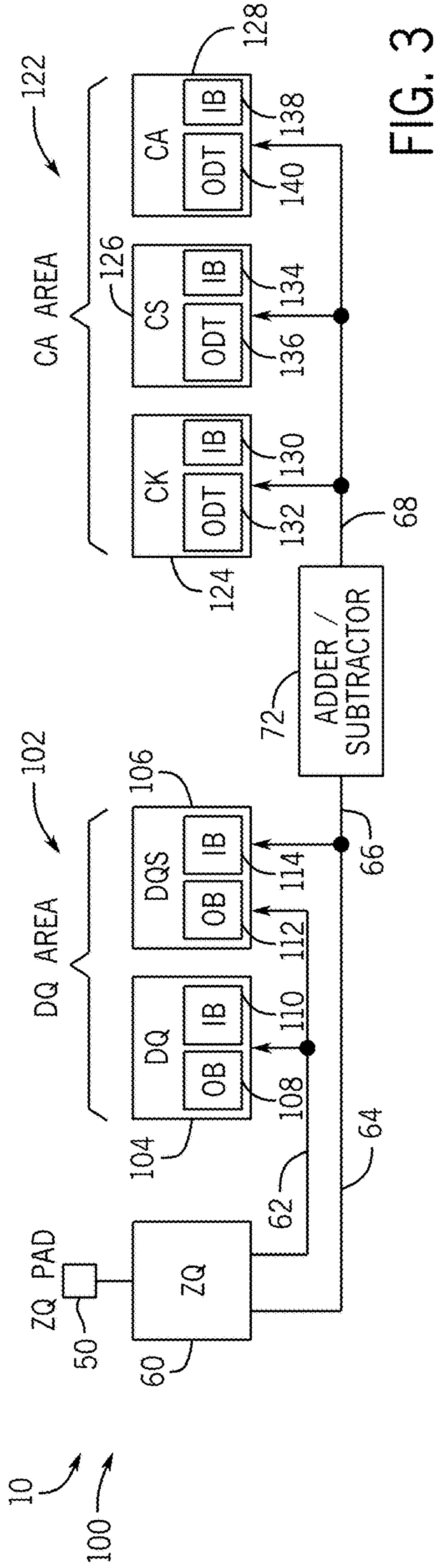
FIG. 3 illustrates a block diagram of an embodiment of the portion of the RTT trim circuit of FIG. 2, according to an embodiment of the present disclosure.

As discussed above, it is desirable to trim the RTTs of the DQ circuit area 102 and the CA circuit area 122, separately. The ZQ circuit 60 may output a ZQ calibration signal 66 that may be used to generate a ZQ-CA calibration signal 68 for the CA circuit area 122 via a logic block 70. In some embodiments, the ZQ calibration signal 66 may include the ZQ pull down calibration signal 62, or the ZQ pull up calibration signal 64, or any combination of them. For example, in the embodiment that the CA circuit areas 122 include termination drivers connected to an upper voltage (e.g., VDD), the ZQ pull up calibration signal 64 may be used for the ZQ calibration signal 66, as illustrated in FIG. 3. In the embodiment that the CA circuit areas 122 include termination drivers connected to a lower voltage (e.g., VSS), the ZQ pull down calibration signal 62 may be used for the ZQ calibration signal 66. The logic block 70 may include any kind of logic circuits. For example, the logic block 70 may include adder/subtractor circuitry, as illustrated in FIG. 3. Therefore, the ZQ-CA calibration signal 68 generated by the logic block 70 may include a different ZQ code than the ZQ code in the ZQ pull down calibration signal 62 or the ZQ code in the ZQ pull up calibration signal 64. In some embodiments, the ZQ calibration signal 66 may be generated by the ZQ circuit 60 independently to the ZQ pull down calibration signal 62 and the ZQ pull up calibration signal 64, as will be described and illustrated with reference to FIG. 6. The ZQ-CA calibration signal 68 generated by the independent ZQ calibration signal 66 may include a ZQ code independent of the ZQ code in the ZQ pull down calibration signal 62 or the ZQ code in the ZQ pull up calibration signal 64. Although the ZQ calibration signal 66 is used to generated a ZQ calibration signal for the CA circuit area 122 in the embodiment illustrated in FIG. 2, the ZQ calibration signal 66 may be used to generated a ZQ calibration signal for other circuit areas (e.g., circuit associated with other external pins). In addition, the ZQ calibration signal 66 may be used to generate a ZQ pull up calibration signal or a ZQ pull down calibration signal for circuit areas other than the DQ circuit area 102.

Figure 4:
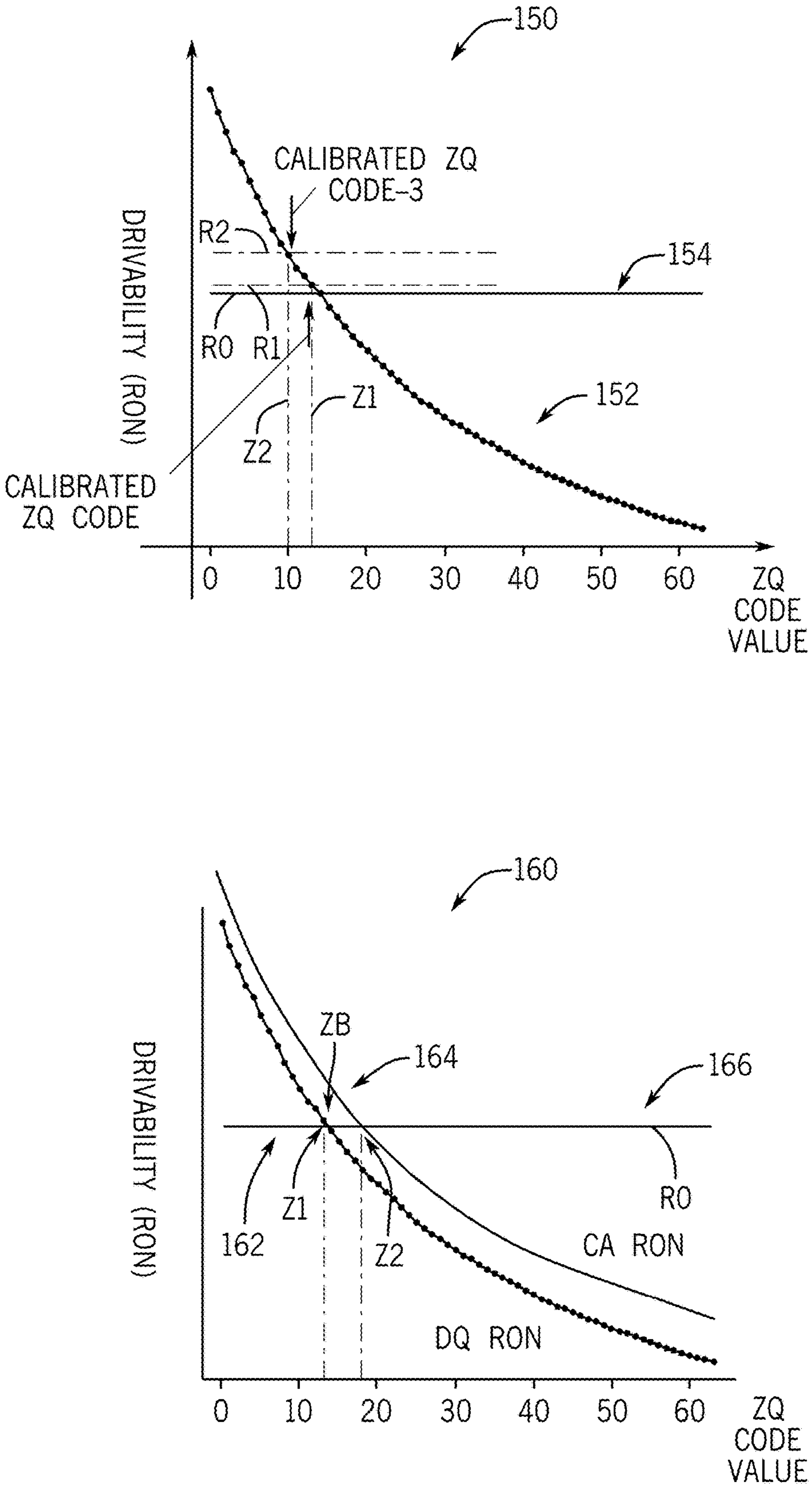
FIG. 4 includes two plots showing two embodiment of a relationship between two ZQ calibration signals generated by the RTT trim circuit of FIG. 3, according to an embodiment of the present disclosure.

As discussed briefly above, FIG. 3 is a block diagram illustrating an embodiment of a portion of the RTT trim circuit 100 having a logic block 72 that may be used to generate the ZQ-CA calibration signal 68. In the embodiment illustrated in FIG. 3, the ZQ calibration signal 66, which is used by the logic block 72 to generate the ZQ_CA calibration signal 68, may be the same as the ZQ pull up calibration signal 64. The logic block 72 may include adder/subtractor circuitry to add or subtract a number (e.g., 0, 1, 2, 3 . . . ) from a ZQ code of the ZQ calibration signal 66 in order to obtain a ZQ code for the ZQ_CA calibration signal 68. Accordingly, the ZQ code for the ZQ_CA calibration signal 68 may have a value greater or less than the ZQ code of the ZQ pull up calibration signal 64 by an integer number (e.g., 0, 1, 2, 3 . . . ), as illustrated in FIG. 4. The logic block 72 may include an optional fuse to protect the circuit. The logic block 72 may generate the ZQ code for the ZQ_CA calibration signal 68 based on characteristics associated with the CA circuit area 122 (e.g., power supply resistance in the CA circuit area 122).

FIG. 4 includes a plot 150 showing an embodiment of a relationship between the ZQ code of the ZQ_CA calibration signal 68 and the ZQ code of the ZQ pull up calibration signal 64 when the DQ circuit area 102 and the CA circuit area 122 have the same drivability curves. In the plot 150, a curve 152 includes data representing a relationship between the ZQ code value (e.g., corresponding decimal value of the ZQ code) and the drivability (on resistance (Ron)) of the resistor driver for both the DQ circuit area 102 and the CA circuit area 122, and a line 154 indicates the base line of the drivability (e.g., 2400) corresponding to a base resistance R0 (e.g., 2400). The ZQ pull up calibration signal 64 may have a calibrated ZQ code with a value of Z1 corresponding to a resistance R1, and the ZQ code of the ZQ_CA calibration signal 68 may have any value on the curve 152, such as Z2 (e.g., Z2=Z1−3) corresponding to a resistance R2. Accordingly, the ZQ code of the ZQ_CA calibration signal 68 may be greater than or less than the ZQ code of the ZQ pull up calibration signal 64 by any integer number (e.g., 0, 1, 2, 3 . . . ) as long as the ZQ code of the ZQ_CA calibration signal 68 is in the drivability range (e.g., 210Ω to 270Ω) of the driver. FIG. 4 also includes a plot 160 showing another embodiment of a relationship between the ZQ code of the ZQ_CA calibration signal 68 and the ZQ code of the ZQ pull up calibration signal 64 when the DQ circuit area 102 and the CA circuit area 122 have different drivability curves (e.g., due to different power supply parasitic resistance). In plot 160, a curve 162 includes data representing a relationship between the ZQ code value (e.g., corresponding decimal value of the ZQ code) and the drivability (on resistance (Ron)) of the resistor driver for DQ circuit area 102, and a curve 164 includes data representing a relationship between the ZQ code value (e.g., corresponding decimal value of the ZQ code) and the drivability (on resistance (Ron)) of the resistor driver for CA circuit area 122. A line 166 indicates the base line of the drivability corresponding to a base resistance R0 (e.g., 240Ω) with a corresponding ZQ code value Zb on the curve 162. In one embodiment, the value Zb may not correspond to an exact ZQ code. The ZQ pull up calibration signal 64 may have a calibrated ZQ code with a value of Z1 (e.g., a ZQ code nearest to the target ZQ value Zb) on the curve 162, and the ZQ code of the ZQ_CA calibration signal 68 may have a calibrated ZQ code (e.g., a ZQ code nearest to the target ZQ value Zb) with a value of Z2, such as Z2 on the curve 164. Accordingly, the ZQ code of the ZQ_CA calibration signal 68 may be greater than or less than the ZQ code of the ZQ pull up calibration signal 64 by any integer number (e.g., 0, 1, 2, 3 . . . ). For example, in the embodiment illustrated in the plot 160, the ZQ code of the ZQ_CA calibration signal 68 is greater than the ZQ code of the ZQ pull up calibration signal 64 (e.g., Z2=Z1+5).

Figure 5:
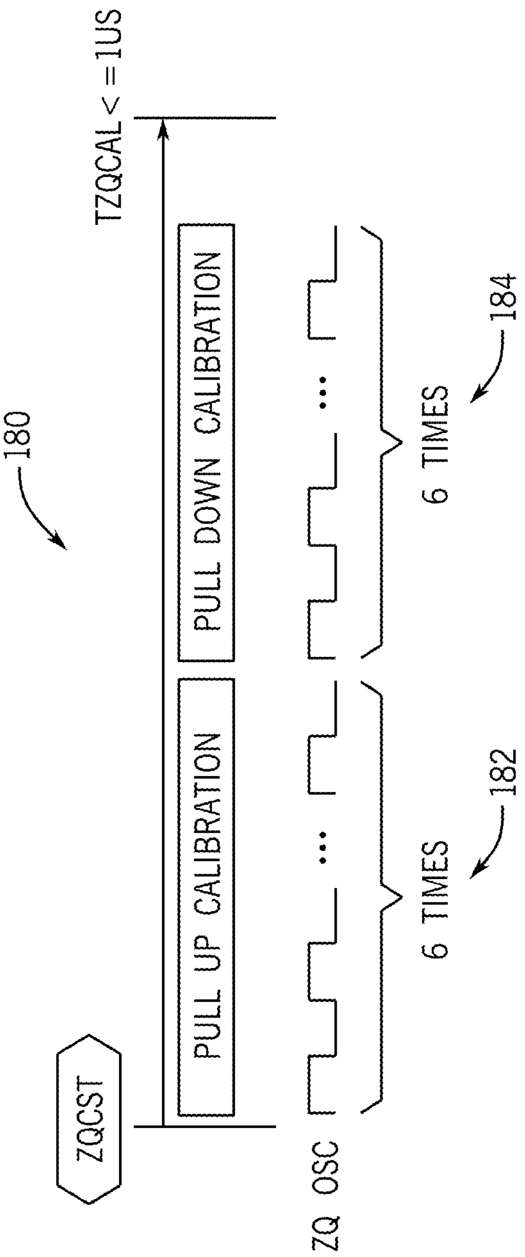
FIG. 5 illustrates a timing diagram for generating ZQ calibration signals using the RTT trim circuit of FIG. 3, according to an embodiment of the present disclosure.

FIG. 5 illustrates a timing diagram 180 for generating ZQ calibration signals using the embodiment of the RTT trim circuit 100 of FIG. 3. In FIG. 5, ZQ codes may be determined for the ZQ pull down calibration signal 62 and the ZQ pull up calibration signal 64, and the ZQ pull up calibration signal 64 may be used to generate the ZQ_CA calibration signal 68 via the logic block 70 (e.g., the logic block 72). In FIG. 5, a ZQ calibration start (ZQCST) command may be used to trigger the generation the ZQ calibration signals. The total time period that may be used for generating the calibration signals may be tZQCAL, which may have a maximum value (e.g., tZQCAL≤1 μs). The total time period tZQCAL may include a first time period 182, which may be used to obtain the ZQ code for the ZQ pull up calibration signal 64, and a second time period 184, which may be used to obtain the ZQ code for the ZQ pull down calibration signal 62. The ZQ oscillation timing clock (ZQ OSC) signal may be generated by a ZQ oscillation generator, and the first time period 182 and the second time period 184 may include a number of clock cycles related to the digits of the ZQ code (e.g., at least six searches for a 6-digit ZQ code). For example, the ZQ code may have six bits, and at least six searches may be used during the ZQ calibration to find a ZQ code that is nearest to the target ZQ code. Since the ZQ_CA calibration signal 68 may be generated using the ZQ pull up calibration signal 64, no additional time period may be needed to obtain a ZQ code for generating the ZQ_CA calibration signal 68.

Figure 6:
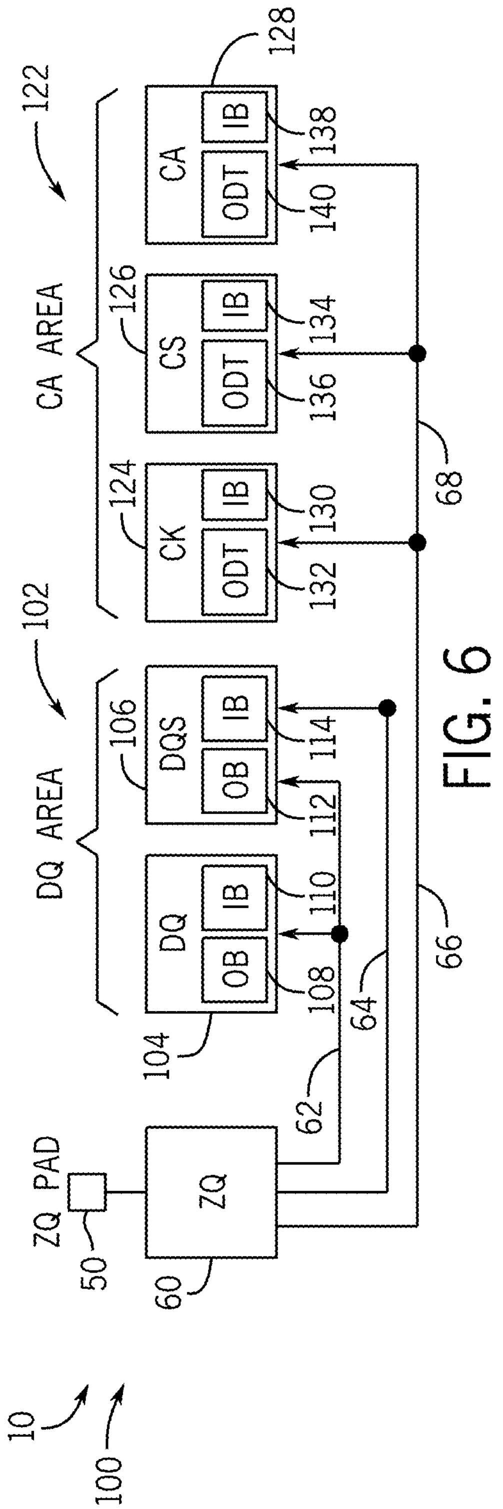
FIG. 6 illustrates a block diagram of another embodiment of the portion of the RTT trim circuit of FIG. 2, according to an embodiment of the present disclosure.

FIG. 6 is a block diagram illustrating another embodiment of the portion of the RTT trim circuit 100 using an independently generated ZQ calibration signal 66 to generate the ZQ-CA calibration signal 68. In FIG. 6, the ZQ calibration signal 66 may be generated by the ZQ circuit 60 independently to the ZQ pull down calibration signal 62 and the ZQ pull up calibration signal 64. In one embodiment, the ZQ calibration signal 66 may be used as the ZQ-CA calibration signal 68 directly. In another embodiment, the ZQ calibration signal 66 may be input into a logic block and generate the ZQ-CA calibration signal 68 using any logic circuit (e.g., adder/subtractor circuitry). Although the ZQ calibration signal 66 is used to generate a ZQ calibration signal for CA circuit area 122 in the embodiment illustrated in FIG. 6, the ZQ calibration signal 66 may be used to generate a ZQ calibration signal for other circuit areas (e.g., circuit associated with other external pins). In addition, the ZQ calibration signal 66 may be used to generate a ZQ pull up calibration signal or a ZQ pull down calibration signal for circuit areas other than the DQ circuit area 102.

Figure 7:
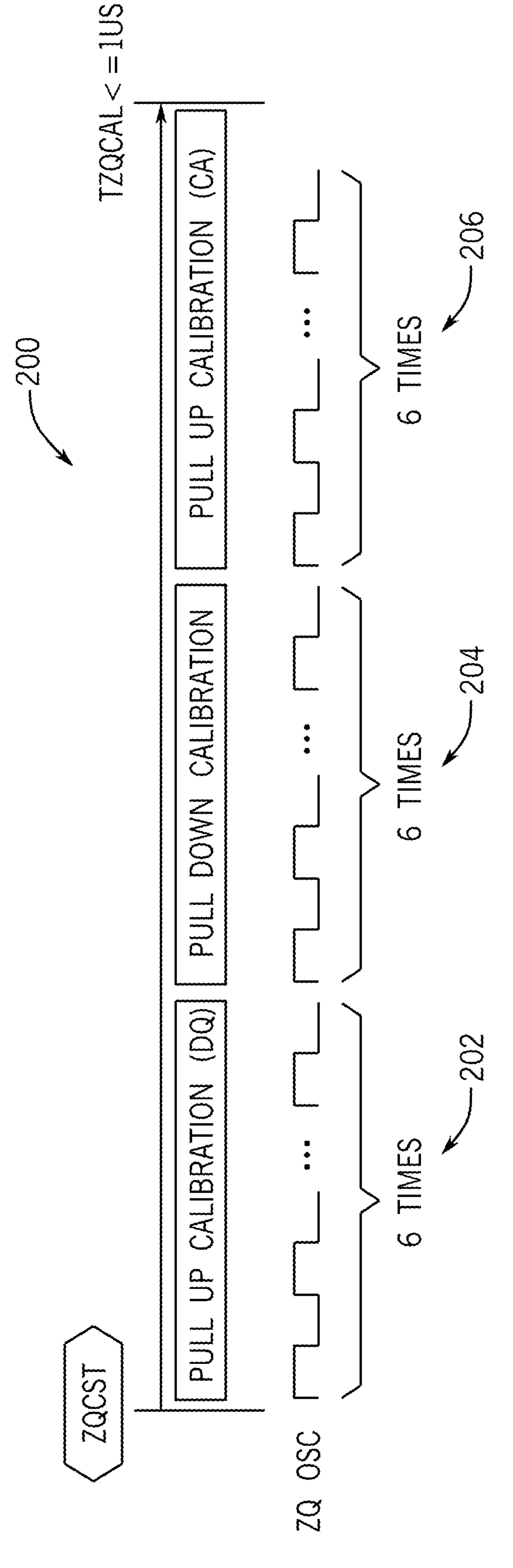
FIG. 7 illustrates a timing diagram of an embodiment of generating ZQ calibration signals for the RTT trim circuit of FIG. 6, according to an embodiment of the present disclosure.
Figure 9:
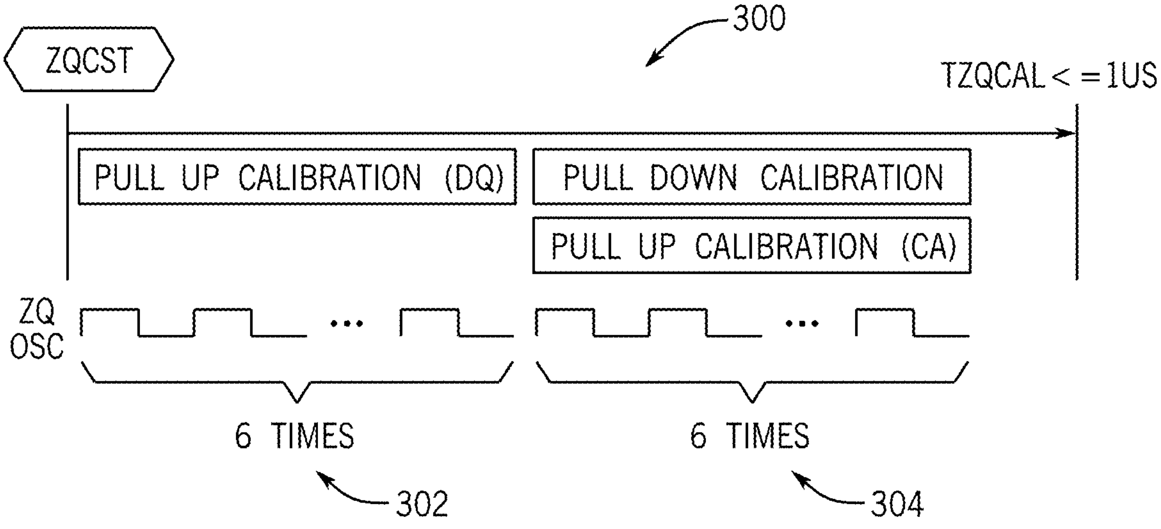
FIG. 9 is a timing diagram of another embodiment of generating ZQ calibration signals for the RTT trim circuit of FIG. 6, according to an embodiment of the present disclosure.
Figure 10:
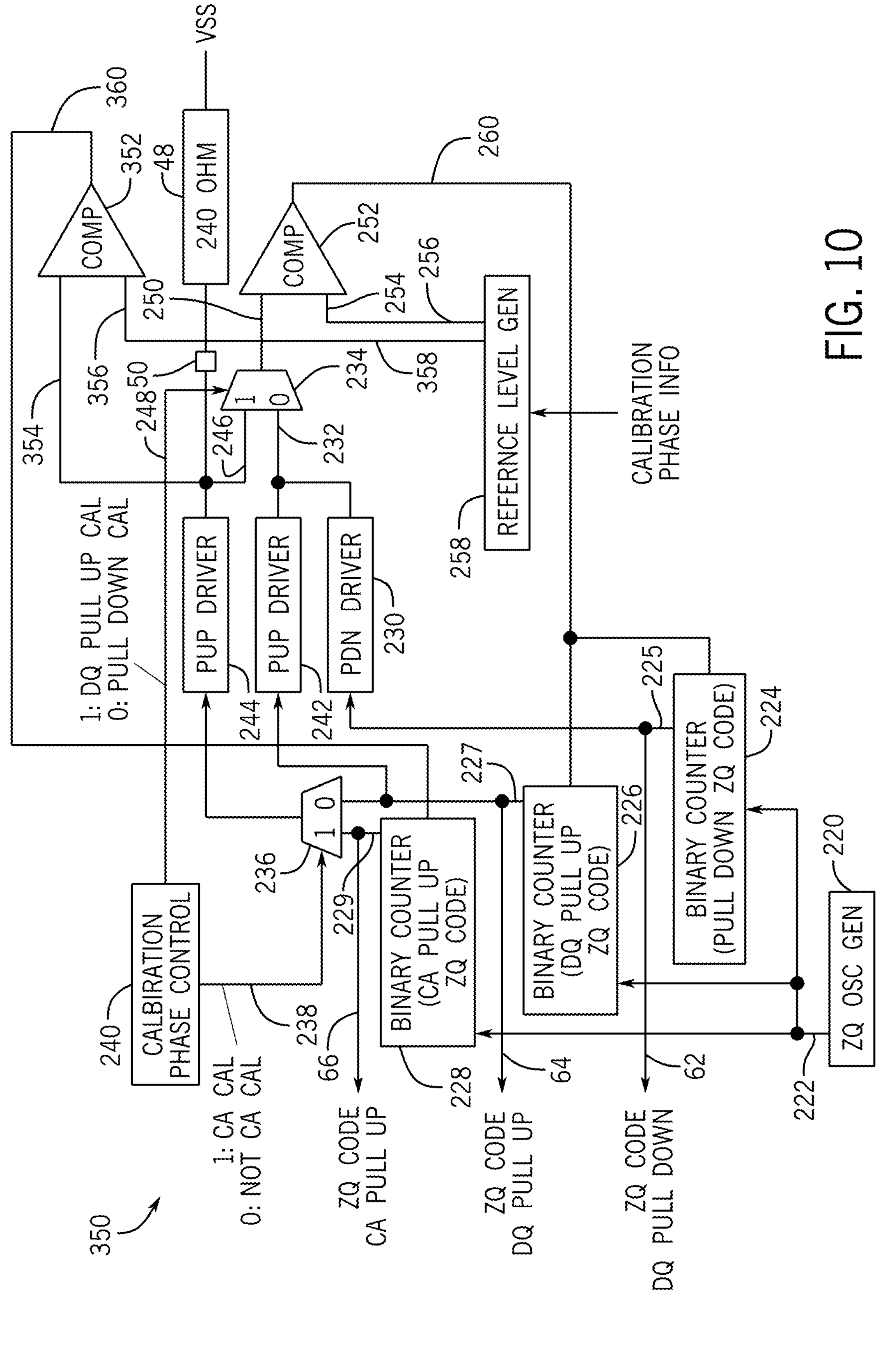
FIG. 10 illustrates a block diagram of an embodiment of a ZQ circuit of the memory device of FIG. 1 that may be used to generate ZQ calibration signals using the timing diagram of FIG. 9, according to an embodiment of the present disclosure.

The ZQ-CA calibration signal 68 generated by the independent ZQ calibration signal 66 may include a ZQ code independent of the ZQ code in the ZQ pull down calibration signal 62 or the ZQ code in the ZQ pull up calibration signal 64. In FIG. 6, the ZQ circuit 60 may generate three calibration signals (e.g., the ZQ pull down calibration signal 62, the ZQ pull up calibration signal 64, and the ZQ calibration signal 66). In some embodiments, an additional time period may be used for generating the ZQ calibration signal 66, as illustrated in FIG. 7. In some embodiments, the time period for generating the calibration signals may be kept unchanged, and additional logic circuits may be used to generate the ZQ calibration signal 66 and the ZQ pull down calibration signal 62 in the same time period, as illustrated in FIG. 9 and FIG. 10.

FIG. 7 illustrates a timing diagram 200 for generating ZQ calibration signals for the embodiment of the RTT trim circuit 100 of FIG. 6. In FIG. 7, ZQ codes may be determined for the ZQ pull down calibration signal 62, the ZQ pull up calibration signal 64, and the ZQ calibration signal 66. In FIG. 7, a ZQ calibration start (ZQCST) command may be used to trigger the generation of the ZQ calibration signals. The total time period that may be used for generating the calibration signals may be tZQCAL, which may have a maximum value (e.g., tZQCAL≤1 μs). The total time period tZQCAL may include a ZQ-DQ pull up calibration period 202 that may be used to obtain the ZQ code for the ZQ pull up calibration signal 64, a ZQ pull down calibration period 204 that may be used to obtain the ZQ code for the ZQ pull down calibration signal 62, and a ZQ-CA pull up calibration period 206 that may be used to obtain the ZQ code for the ZQ calibration signal 66. The ZQ oscillation timing clock (ZQ OSC) signal may be generated by a ZQ oscillation generator, and the time periods 202, 204, and 206 may include a number of clock cycles related to the digits of the ZQ code (e.g., at least six searches for a 6-digit ZQ code). For example, the ZQ code may have six bits, and at least six searches may be used during the ZQ calibration to find a ZQ code that is nearest to the target ZQ code. Since an additional time period 206 is added to the total time period tZQCAL, the frequency of the ZQ OSC signal may be increased, when compared to the frequency of the timing clock in FIG. 5, in order to limit the total time period tZQCAL to be less than or equal to the maximum value (e.g., tZQCAL≤1 μs). The frequency of the ZQ OSC signal may be within a predefined range (e.g., to leave some wait time that may be used to make an internal analog voltage stable after ZQ code switching.).

Figure 8:
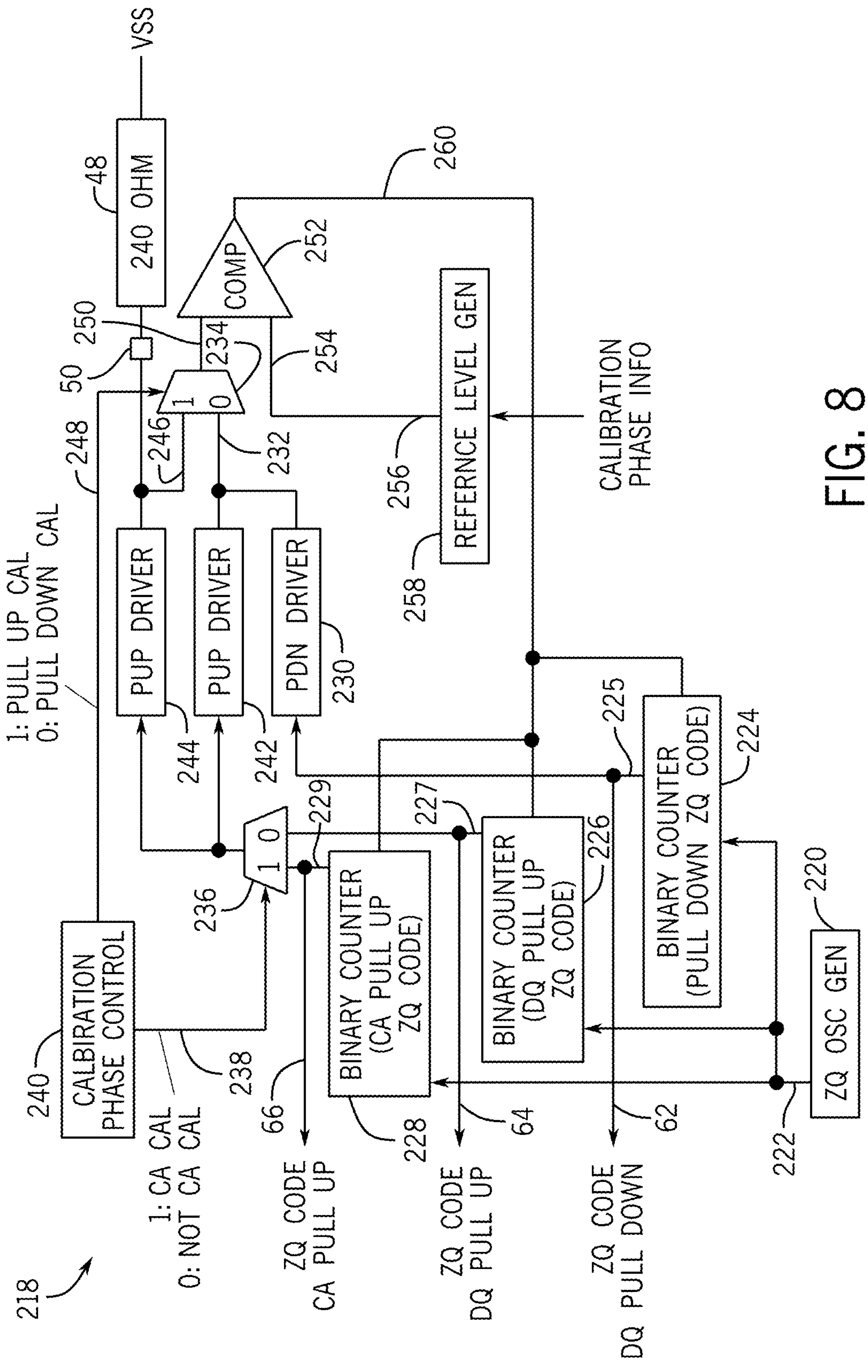
FIG. 8 illustrates a block diagram of an embodiment of a ZQ circuit of the memory device of FIG. 1 that may be used to generate ZQ calibration signals using the timing diagram of FIG. 7, according to an embodiment of the present disclosure.

FIG. 8 is a block diagram of a circuit 218 showing an embodiment of the ZQ circuit 60 that may be used to obtain the ZQ codes of the ZQ pull down calibration signal 62, the ZQ pull up calibration signal 64, and the ZQ calibration signal 66 using respective time periods (e.g. the time period 204, the time period 202, and the time period 206, respectively). In FIG. 8, a ZQ oscillation generator 220 may generate a timing clock signal 222, which may be used to obtain the ZQ codes for the calibration signals (e.g., the ZQ pull down calibration signal 62, the ZQ pull up calibration signal 64, the ZQ calibration signal 66). The timing clock signal 222 may be sent to a binary counter 224 for generating a DQ pull down ZQ code 225 for the ZQ pull down calibration signal 62. The timing clock signal 222 may be sent to a binary counter 226 for generating a DQ pull up ZQ code 227 for the ZQ pull up calibration signal 64. The timing clock signal 222 may be sent to a binary counter 228 for generating a CA pull up ZQ code 229 for the ZQ calibration signal 66, which may be used to generate the ZQ-CA calibration signal 68. The binary counter 224 may send the DQ pull down ZQ code 225 to a pull down (PDN) driver 230, and the PDN driver 230 may be coupled to an input 232 of a selection device 234 (e.g., a multiplexer). The binary counter 226 may send the DQ pull up ZQ code 227 to a selection device 236 (e.g., a multiplexer), and the binary counter 228 may send the CA pull up ZQ code 229 to the selection device 236. The selection device 236 may receive a selection signal 238 from a calibration phase control device 240. The calibration phase control device 240 may generate the selection signal 238 based on a calibration phase (e.g., "0" for NOT CA calibration, "1" for CA calibration). Based on a value (e.g., "0" or "1") of the selection signal 238, the selection device 236 may output the DQ pull up ZQ code 227 or the CA pull up ZQ code 229. For example, when the selection signal 238 has a first value (e.g., "0"), the selection device 236 may output the DQ pull up ZQ code 227 received from the binary counter 226; and, when the selection signal 238 has a second value (e.g., "1"), the selection device 236 may output the CA pull up ZQ code 229 received from the binary counter 228.

The output of the selection device 236 may be coupled to a pull up (PUP) driver 242 and a pull up (PUP) driver 244. The PUP driver 242 may be coupled to the input 232 of the selection device 234. The PUP driver 244 may be coupled to an input 246 of the selection device 234, and the PUP driver 244 may also be coupled to the precision resistor 48 (e.g., 2400) via the ZQ pad 50. The selection device 234 may receive a selection signal 248 from the calibration phase control device 240 and output the signal received at the input 232 or at the input 246 based on a value of the selection signal 248 (e.g., "0" or "1"). The calibration phase control device 240 may generate the selection signal 248 based on a calibration phase (e.g., "0" for pull down calibration, "1" for pull up calibration). For example, when the selection signal 248 has a first value (e.g., "0"), the selection device 234 may output the signal received at the input 232; and, when the selection signal 248 has a second value (e.g., "1"), selection device 234 may output the signal received at the input 246. The output of the selection device 234 may be coupled to an input 250 of a comparator 252. An input 254 of the comparator 252 may receive a reference signal 256 from a reference level generator 258. The reference level generator 258 may generate the reference signal 256 based on a calibration phase (e.g., DQ pull up calibration, DQ pull down calibration, CA pull up calibration), and the reference signal 256 may have a voltage value that may be a percentage (e.g., 70%, 80%, 90%) of the power supply VDD, which corresponds to the target ZQ code. The reference level generator 258 may generate the reference signal 256 based on characteristics associated with the corresponding circuit area (e.g., DQ circuit area 102, CA circuit area 122). For example, the reference signal 256 may be different for the ZQ pull up calibration signal 64 for the DQ circuit area 102 and the ZQ calibration signal 66 that may be used to generate a ZQ-CA calibration signal 68 for the CA circuit area 122 (e.g., power supply resistance in the CA circuit area 122 may be different from the DQ circuit area 102). The comparator 252 may compare the signals received at the input 250 with the reference signal 256 received at the input 254 and output a signal 260 that may have a value (e.g., "0" or "1") based on a relationship between the signal received at the input 250 and the reference signal 256. For example, when the signal received at the input 250 is greater than the reference signal 256 received at the input 254, the signal 260 may have a value of "1", and when the signal received at the input 250 is less than the reference signal 256 received at the input 254, the signal 260 may have a value of "0". The signal 260 may be transmitted to the binary counters 224, 226, and 228 for counting (e.g., incrementing or decrementing) the corresponding ZQ codes. Accordingly, the DQ pull down ZQ code 225, the DQ pull up ZQ code 227, and the CA DQ pull up ZQ code 229 may be updated based on the corresponding value of the signal 260.

The binary counters 224, 226, and 228 may only be enabled (e.g., by implementing the selection signal 238 and/or the selection signal 248) to count (e.g., increment or decrement) the corresponding ZQ codes during the corresponding calibration periods. For example, the binary counter 224 may be enabled to count the DQ pull down ZQ code 225 during the ZQ pull down calibration period (e.g., the time period 204), the binary counter 226 may be enabled to count the DQ pull up ZQ code 227 during the ZQ-DQ pull up calibration period (e.g., the time period 202), and the binary counter 228 may be enabled to count the CA pull up ZQ code 229 during the ZQ-CA pull up calibration period (e.g., the time period 206). When the signal 260 has a certain value (e.g., "0" or "1"), the corresponding binary counters may stop counting (e.g., incrementing or decrementing) the ZQ codes, and the final ZQ codes may be used to generate the corresponding ZQ calibration signals (e.g., the ZQ pull down calibration signal 62, the ZQ pull up calibration signal 64, the ZQ calibration signal 66).

For example, during a ZQ pull up calibration process, when the analog level of voltage at the input 250 is greater than the voltage value of the reference signal 256 received at the input 254, the signal 260 may have a value of "1" indicating that the signal received at the input 250 is greater than the reference signal 256 received at the input 254, and the corresponding binary counter may decrement the corresponding ZQ code to reduce the analog level of voltage at the input 250 (e.g., the ZQ code may be inversely proportional to the Ron of the driver, as illustrated in FIG. 4). When the input 250 is not greater than (e.g., equal or less than) the input 254, the signal 260 may have a value of "0" indicating that the signal received at the input 250 is not greater than the reference signal 256 received at the input 254, and the corresponding binary counters may increment the corresponding ZQ codes to increase the analog level of voltage at the input 250. The final ZQ codes in the corresponding binary counters may be used to generate the corresponding calibration signals. In some embodiments, binary search algorithm may be used to reduce seeking time of the final ZQ codes during the ZQ calibration process.

In another example, during a ZQ pull down calibration process, when the analog level of voltage at the input 250 is less than the voltage value of the reference signal 256 received at the input 254, the signal 260 may have a value of "0" indicating that the signal received at the input 250 is less than the reference signal 256 received at the input 254, and the corresponding binary counter may decrement the corresponding ZQ code to increase the analog level of voltage at the input 250 (e.g., the ZQ code may be inversely proportional to the Ron of the driver, as illustrated in FIG. 4). When the input 250 is greater than the input 254, the signal 258 may have a value of "1" indicating that the signal received at the input 250 is greater than the reference signal 256 received at the input 254, and the corresponding binary counters may increment the corresponding ZQ code to reduce the analog level of voltage at the input 250. The final ZQ codes in the corresponding binary counters may be used to generate the corresponding calibration signals. In some embodiments, binary search algorithm may be used to reduce seeking time of the final ZQ codes during the ZQ calibration process.

In FIG. 8, the resistance of the PUP driver 242 may be determined when obtaining the DQ pull up ZQ code 227 for the ZQ pull up calibration signal 64 or the CA pull up ZQ code 229 for the ZQ calibration signal 66, and it may be used to determine the resistance of the PDN driver 230. For example, when the selection signal 238 has a value of "0" (e.g., during the time period 202), the DQ pull up ZQ code 227 may be selected by the selection device 236 and output to the PUP driver 242 and the PUP driver 244. During the time period 202, the selection signal 248 may have a value of "1", and the input 246 may be selected by the selection device 234 and output to the input 250 of the comparator 252 to generate the signal 260 based on a reference signal 256 generated for the ZQ pull up calibration signal 64. The input 246 may have an analog level of voltage that may be determined by a resistance of the PUP driver 244 and the precision resistor 48, as illustrated in FIG. 8. Since the resistor 48 may have a precise predetermined resistance (e.g., 240 ohm (Ω)), the resistance of the PUP driver 244 may be determined by using the corresponding reference signal 256 generated by the reference level generator 258 for the ZQ pull up calibration signal 64, as described above. The final DQ pull up ZQ code 227 may be used to generate the ZQ pull up calibration signal 64. Since the DQ pull up ZQ code 227 may be output to the PUP driver 242 and the PUP driver 244 during the time period 202, the PUP driver 242 may be adjusted to have the same resistance as the PUP driver 244 corresponding to the DQ pull up ZQ code 227. Since the binary counters may only be enabled during corresponding time periods, the resistance of the PUP driver 242 may be maintained according to the final DQ pull up ZQ code 227 after the time period 202, and it may be used to determine the resistance of the PDN driver 230 during other time period after the time period 202 (e.g., during the time period 204).

During the period 204, the selection signal 248 may have a value of "0" and the input 232 may be selected by the selection device 234 and output to the input 250 of the comparator 252 to generate the signal 260 based on a reference signal 256 generated for the ZQ pull down calibration signal 62. The analog level of voltage at the input 232 may be determined by a resistance of the PUP driver 242 and a resistance of the PDN driver 230, as illustrated in FIG. 8. Since the resistance of the PUP driver 242 is determined in the time period 202, the resistance of the PDN driver 230 may be determined by using the corresponding reference signal 256 generated by the reference level generator 258 for the ZQ pull down calibration signal 62, as described above. The final value of the DQ pull down ZQ code 225 may be used to generate the ZQ pull down calibration signal 62.

When the selection signal 238 has a value of "1" (e.g., during the time period 206), the CA pull up ZQ code 229 may be output to the PUP driver 242 and the PUP driver 244. During the time period 206, the selection signal 248 may have a value of "1", and the input 246 may be selected by the selection device 234 and output to the input 250 of the comparator 252 to generate the signal 260 based on a reference signal 256 generated for the ZQ calibration signal 66. The input 246 may have a value that may be determined by a resistance of the PUP driver 244 and the precision resistor 48, as illustrated in FIG. 8. Since the resistor 48 may have a precise predetermined resistance (e.g., 240 ohm (Ω)), the resistance of the PUP driver 244 may be determined by using the corresponding reference signal 256 generated by the reference level generator 258 for the ZQ calibration signal 66, as described above. The final CA pull up ZQ code 229 may be determined and used to generate the ZQ calibration signal 66. Since the CA pull up ZQ code 229 may also be transmitted to the PUP driver 242 during the time period 206, the PUP driver 242 may be adjusted to have the same resistance as the PUP driver 244 corresponding to the CA pull up ZQ code 229.

As discussed previously in paragraphs regarding FIG. 7, the frequency of the timing clock generated by the ZQ oscillation generator may be increased in order to include the time period 206, which is used to obtain the ZQ code for generating the ZQ calibration signal 66, and to limit the total time period tZQCAL to be less than or equal to the maximum value (e.g., tZQCAL≤1 μs). In some embodiments, additional logic circuits may be used in the ZQ circuit 60 to obtain the ZQ codes for the ZQ pull down calibration signal 62 and the ZQ calibration signal 66 simultaneously, as illustrated in FIG. 9. FIG. 9 illustrates a timing diagram 300 for generating ZQ calibration signals for the embodiment of the RTT trim circuit 100 of FIG. 6. In FIG. 9, ZQ codes may be determined for the ZQ pull up calibration signal 64 and the ZQ calibration signal 66 simultaneously. In FIG. 9, a ZQ calibration start (ZQCST) command may be used to trigger the generation the ZQ calibration signals. The total time period that may be used for generating the calibration signals may be tZQCAL, which may have a maximum value (e.g., tZQCAL≤1 μs). The total time period tZQCAL may include a first time period 302 that may be used to obtain the ZQ code for the ZQ pull up calibration signal 64, and a second time period 304 that may be used to obtain the ZQ code for the ZQ pull down calibration signal 62 and the ZQ code for the ZQ calibration signal 66 simultaneously. The ZQ oscillation timing clock (ZQ OSC) signal may be generated by a ZQ oscillation generator, and the time periods 302 and 304 may include a number of clock cycles related to the digits of the ZQ code (e.g., at least six searches for a 6-digit ZQ code). For example, the ZQ code may have six bits, and at least six searches may be used during the ZQ calibration to find a ZQ code that is nearest to the target ZQ code. Since the ZQ code for the ZQ pull down calibration signal 62 and the ZQ code for the ZQ calibration signal 66 may be obtained during the same time period 304, the frequency of the ZQ OSC may be unchanged when compared to the frequency of the ZQ OSC signal in FIG. 5. Accordingly, the embodiment illustrated in FIG. 9 may be beneficial to keep the frequency of the ZQ OSC signal generated by the ZQ oscillation generator within a predefined range (e.g., to leave some wait time that may be used to make an internal analog voltage stable after ZQ code switching.).

FIG. 10 is a block diagram of a circuit 350 showing an embodiment of the ZQ circuit 60 that may be used to obtain the ZQ codes for the ZQ pull down calibration signal 62 and the ZQ calibration signal 66 simultaneously (e.g. during the time period 304). In FIG. 10, an additional comparator 352 may be used in the ZQ circuit 60. The PUP driver 244 may be coupled to an input 354 of the comparator 352, and an input 356 of the comparator 352 may receive an additional reference signal 358 generated by the reference level generator 258. The reference level generator 258 may generate the reference signal 358 based on characteristics associated with the CA circuit area 122 (e.g., power supply resistance in the CA circuit area 122), and the reference signal 358 may have a voltage value that may be a percentage (e.g., 70%, 80%, 90%) of the power supply VDD, which corresponds to the target ZQ code (e.g., target ZQ code of the CA pull up ZQ code 229). The comparator 352 may compare the signals received at the input 354 with the reference signal 358 received at the input 356 and output a signal 360 that may have a value (e.g., “0” or “1”) based on a relationship between the signal received at the input 354 and the reference signal 358. For example, when the signal received at the input 354 is greater than the reference signal 358 received at the input 356, the signal 360 may have a value of “1”, and when the signal received at the input 354 is less than the reference signal 358 received at the input 356, the signal 360 may have a value of “0”. In FIG. 10, the binary counter 228 may not receive the signal 260 from the comparator 252, instead, the signal 360 may be transmitted to the binary counter 228 for counting (e.g., incrementing or decrementing) the CA pull up ZQ code 229. In FIG. 10, the PUP driver 242 may be coupled to the binary counter 226 to receive the DQ pull up ZQ code 227, and the PUP driver 242 may not be coupled to the output of the selection device 236. In FIG. 10, the calibration phase control device 240 may generate the selection signal 248 based on a calibration phase of the calibration signals. In the embodiment illustrated in FIG. 10, the selection signal 248 may have a value of “0” for ZQ pull down calibration (e.g., during the time period 304 for calibrating the ZQ pull down calibration signal 62), and the selection signal 248 may have a value of “1” only for ZQ pull up calibration for the DQ circuit area 102 (e.g., during the time period 302 for calibrating the ZQ pull up calibration signal 64). Based on a value (e.g., “0” or “1”) of the selection signal 248, the selection device 234 may output the signal received at the input 232 or the input 246. For example, when the selection signal 248 has a first value (e.g., “0”), the selection device 234 may output the signal received at the input 232; and, when the selection signal 248 has a second value (e.g., “1”), selection device 234 may output the signal received at the input 246.

During the time period 302, the selection signal 238 may have a value of “0”, the DQ pull up ZQ code 227 may be selected by the selection device 236 and output to the PUP driver 244. During the time period 302, the selection signal 248 may have a value of “1”, and the input 246 may be selected by the selection device 234 and output to the input 250 of the comparator 252 to generate the signal 260 based on a reference signal 256 generated for the ZQ pull up calibration signal 64. Since the binary counters may only be enabled during the corresponding time periods, only the binary counter 226 may be enabled during the time period 302, and the binary counters 224 and 228 may be disabled during the time period 302. The input 246 may have an analog level of voltage that may be determined by a resistance of the PUP driver 244 and the precision resistor 48, as illustrated in FIG. 10. Since the resistor 48 may have a precise predetermined resistance (e.g., 240 ohm (Ω)), the resistance of the PUP driver 244 may be determined by using the corresponding reference signal 256 generated by the reference level generator 258 for the ZQ pull up calibration signal 64, as described above. The final DQ pull up ZQ code 227 may be used to generate the ZQ pull up calibration signal 64. Since the PUP driver 242 may be coupled to the binary counter 226 to receive the DQ pull up ZQ code 227, the PUP driver 242 may be adjusted to have the same resistance as the PUP driver 244 during the time period 302 corresponding to the DQ pull up ZQ code 227. Since the binary counters may only be enabled during corresponding time periods, the resistance of the PUP driver 242 may be maintained according to the final DQ pull up ZQ code 227 after the time period 302, and it may be used to determine the resistance of the PDN driver 230 during the time period 304.

During the time period 304, the selection signal 238 may have a value of “1” and the selection signal 248 may have a value of “0”, and the CA pull up ZQ code 229 may be selected by the selection device 236 and output to the PUP driver 244, which is coupled to the input 354 of the comparator 352. During the time period 304, the binary counter 228 and the binary counter 224 may be enabled, and the binary counter 226 may be disabled. The analog level of voltage at the input 354 may be determined by a resistance of the PUP driver 244 and the precision resistor 48, as illustrated in FIG. 10. Since the resistor 48 may have a precise predetermined resistance (e.g., 240 ohm (Ω)), the resistance of the PUP driver 244 may be determined by the comparator 352 using the corresponding reference signal 356 generated by the reference level generator 258 for the ZQ calibration signal 66. The final CA pull up ZQ code 229 may be used to generate the ZQ calibration signal 66.

During the period 304, the selection signal 248 may have a value of “0” and the input 232 may be selected by the selection device 234 and output to the input 250 of the comparator 252 to generate the signal 260 based on a reference signal 256 generated for the ZQ pull down calibration signal 62. The analog level of voltage at the input 232 may be determined by a resistance of the PUP driver 242 and a resistance of the PDN driver 230, as illustrated in FIG. 10. Since the resistance of the PUP driver 242 is determined in the time period 302, the resistance of the PDN driver 230 may be determined by the comparator using the corresponding reference signal 256 generated by the reference level generator 258 for the ZQ pull down calibration signal 62, as described above. The final value of the DQ pull down ZQ code 225 may be used to generate the ZQ pull down calibration signal 62. Accordingly, the ZQ code for the ZQ pull down calibration signal 62 and the ZQ code for the ZQ calibration signal 66 may be obtained simultaneously during the same time period 304.

Accordingly, the technical effects of the present disclosure include methods and systems for trimming RTTs in a memory device. The effective termination resistance (RTT) of the ODT may be adjusted by adjusting one or more driver units having predefined values (e.g., 240Ω). Because PVT characteristics may impact the driver unit values, resistances of the driver units may be fluctuated away from the predefined values (e.g., 240Ω). ZQ calibration signals may be used to calibrate the resistances of the driver units to the predefined values (e.g., 240Ω) to trim the RTTs. Separate ZQ calibration signals may be generated for different circuit areas (e.g., DQ circuit area 102, CA circuit area 122). In addition, two ZQ calibration signals may be generated simultaneously by a ZQ circuit during the same time period.

It should be understood that logically-equivalent circuitry may be used to implement the systems and methods described above. For example, a logical XOR gate may be replaced via a logically-equivalent combination of NOT gates, AND gates, Inverse NOT gates, OR gates, NAND gates, NOR gates, or the like.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:

a first external pin communicatively coupled to a first circuit;

a second external pin communicatively coupled to a second circuit different from the first circuit; and a calibration circuit comprising a logic circuit that is configured to modify ZQ codes, wherein the calibration circuit is configured to:

generate a first calibration signal comprising a first ZQ code for calibrating a first termination resistance of the first circuit; and generate a second calibration signal comprising a second ZQ code, wherein the second ZQ code is generated via the logic circuit by using the first ZQ code, and wherein the second calibration signal is for calibrating a second termination resistance of the second circuit.

2. The apparatus of claim 1, wherein the first circuit comprises one of a pull-up driver and a pull-down driver having the first termination resistance and the other of the pull-up driver and the pull-down driver having a third termination resistance, and wherein the calibration circuit is configured to generate a third calibration signal comprising a third ZQ code for calibrating the third termination resistance.

3. The apparatus of claim 1, wherein the second circuit comprises a termination driver having the second termination resistance.

4. The apparatus of claim 1, wherein the calibration circuit is in a memory chip and configured to generate the first calibration signal based on a precision resistor arranged outside of the memory chip.

5. The apparatus of claim 1, wherein the logic circuit comprises adder/subtractor circuitry.

6. The apparatus of claim 5, wherein the first ZQ code is different from the second ZQ code by an integer number.

7. The apparatus of claim 1, wherein the calibration circuit is configured to generate the second calibration signal based on characteristics associated with the second circuit.

8. The apparatus of claim 1, wherein the calibration circuit is configured to generate the first calibration signal and the second calibration signal within a threshold time period.

9. A method, comprising:

generating, via a calibration circuit comprising a logic circuit that is configured to modify ZQ codes, a first calibration signal comprising a first ZQ code for calibrating a first termination resistance of a first circuit communicatively coupled to a first external pin; and generating a second calibration signal comprising a second ZQ code, wherein the second ZQ code is generated via the logic circuit by using the first ZQ code, and wherein the second calibration signal is for calibrating a second termination resistance of a second circuit communicatively coupled to a second external pin, wherein the second circuit is different from the first circuit.

10. The method of claim 9, comprising:

generating a third calibration signal comprising a third ZQ code for calibrating a third termination resistance, wherein the first circuit comprises one of a pull-up driver and a pull-down driver having the first termination resistance and the other of the pull-up driver and the pull-down driver having the third termination resistance.

11. The method of claim 10, wherein the second circuit comprises a termination driver having the second termination resistance.

12. The method of claim 9, wherein generating the first calibration signal comprises generating the first calibration signal based on a precision resistor.

13. The method of claim 9, wherein the logic circuit comprises adder/subtractor circuitry.

14. The method of claim 13, wherein the first ZQ code is different from the second ZQ code by an integer number.

15. The method of claim 9, wherein generating the second calibration signal comprises generating the second calibration signal based on characteristics associated with the second circuit.

16. An apparatus, comprising:

a first external pin;

a second external pin;

a first circuit coupled to the first external pin, the first circuit including a pull-up driver and a pull-down driver;

a termination driver coupled between the second external pin and a voltage node; and a ZQ circuit comprising a logic circuit that is configured to modify ZQ codes, wherein the ZQ circuit is configured to generate a first calibration signal comprising a first ZQ code for calibrating a first termination resistance of the pull-up driver of the first circuit, a second calibration signal comprising a second ZQ code for calibrating a second termination resistance of the pull-down driver of the first circuit and a third calibration signal comprising a third ZQ code for calibrating a third termination resistance of the termination driver, the third ZQ code being generated via the logic circuit based on one of the first ZQ code and the second ZQ code.

17. The apparatus of claim 16, wherein the voltage node is supplied with a lower voltage and the third ZQ code is generated based on the second ZQ code.

18. The apparatus of claim 16, wherein the voltage node is supplied with an upper voltage and the third ZQ code is generated based on the first ZQ code.

19. The apparatus of claim 16, wherein the third ZQ code is generated by a logic circuit comprising adder/subtractor circuitry.

20. The apparatus of claim 19, wherein the logic circuit is configured to generate the third ZQ code based on characteristics associated with the termination driver.

* * * * *